United States Patent
Nelson et al.

(10) Patent No.: US 6,654,469 B1
(45) Date of Patent: Nov. 25, 2003

(54) METHODS AND DEVICES FOR REDUCING SAMPLING NOISE IN ANALOG SIGNALS USING LINEAR INTERPOLATION

(75) Inventors: Dale H. Nelson, Shillington, PA (US); Tseng-Nan Tsai, Allentown, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/340,439

(22) Filed: Jun. 28, 1999

(51) Int. Cl.⁷ .............................................. H04B 15/00
(52) U.S. Cl. ....................... 381/94.1; 341/122; 381/94.4
(58) Field of Search ................... 381/94.1, 94.9, 381/123, 94.2, 94.4, 94.8, 94.5, 71.1; 341/122, 125; 330/254, 278; 327/9, 94

(56) References Cited

U.S. PATENT DOCUMENTS 5,744,985 A * 4/1998 Nishida ........................ 327/94
6,510,313 B1 * 1/2003 Rapeli ........................ 341/122

* cited by examiner

*Primary Examiner*—Minsun Oh Harvey

(57) ABSTRACT

Sampling noise in an analog signal output from a codec, such as a speech codec, is reduced using linear interpolation. The output of a codec is input into two sample and hold circuits. The circuits generate two output signals (i.e. voltages) for each input signal. One of the output signals represents an interpolated signal located midway between an historical output signal and input signal. The generation of interpolated output signals reduces sampling noise.

48 Claims, 2 Drawing Sheets

METHODS AND DEVICES FOR REDUCING SAMPLING NOISE IN ANALOG SIGNALS USING LINEAR INTERPOLATION

BACKGROUND OF THE INVENTION

The advent of specialized, electronic components has made it possible to design and build sophisticated audio and video devices which are capable of producing high-quality reproductions of sounds, pictures and the like. One type of component often used is a digital signal processor ("DSP"). Generating audio or video signals requires other electronic components in addition to DSPs. One common component is a coder-decoder, otherwise known in the art as a "codec".

Typically, original audio signals (e.g., sounds) and video signals (e.g., pictures) are made up of "analog" signals. The function of a codec is to convert or "code" an analog signal into a "digital" one so that the signal can be processed and the like. Likewise, it is sometimes desirable to convert or "decode" a stored digital signal into an analog signal for output to another device such as an audio speaker or video display. The differences between analog and digital signals are well known in the art and need not be discussed here in great detail.

"Single channel" codecs perform the coding/decoding just discussed on one audio/video "channel" or signal. One advantage of using a DSP in combination with a codec is the ability to "multiplex" or combine a number of signals into one signal. Multiplexing may be envisioned as the interleaving of data from separate signals to form one signal. It is possible, therefore, for a codec to output a multiplexed signal (or as the case may be, output a "demultiplexed" signal). Codecs which use "time-multiplexing" operate by designating certain time slots for each signal. Interleaving is accomplished by taking data from each signal only during predetermined time slots. Again, in general, multiplexing is well known in the art and need not be discussed here in detail.

There are, however, problems associated with time-multiplexing multiple channels using a codec/DSP combination. One problem relates to "sampling noise". An analog signal can be divided into two portions; a "signal" portion which consists of useful data and a "noise" portion which consists of interfering, non-useful data. At some point, a digitized signal is converted back into an analog signal by the digital-to-analog conversion section of a codec. The analog signal must then be output from the codec to an external device, such as a speaker or display. Digital signals are typically "clocked" out of a digital-to-analog converter and fed to a single "sample and hold" circuit. During the process of sampling and holding the signal, sampling noise is introduced.

Attempts have been made to reduce sampling noise by increasing the rate at which the digital signal is fed to the digital-to-analog converter and sampled/held. It is sometimes not feasible to do so, however, because in some instances the sampling rate and/or clock frequency is fixed. As a last resort, another electronic device, called a filter, is connected to the output of the codec. The filter effectively removes the noise but, it is an expensive solution.

Accordingly, it is an object of the present invention to provide devices and methods which reduce sampling noise in sample and hold circuits.

It is a further object of the present invention to provide devices and methods which reduce sampling noise in an analog signal output from a digital-to-analog converter.

It is yet another object of the present invention to provide devices and methods which reduce sampling noise in an analog signal output from a codec, such as a speech codec.

Other objectives, features and advantages of the present invention will become apparent to those skilled in the art from the following description taken in conjunction with the accompanying drawings.

SUMMARY OF THE INVENTION

The present invention provides novel devices and methods which reduce sampling noise in an analog signal without the need to increase the sampling rate or use additional external filters.

The novel devices and methods apply linear interpolation to sampled analog signals. In one illustrative embodiment, a novel device comprises two sample and hold circuits which alternatively transfer voltages derived from portions or samples of an analog, input voltage signal to an output capacitance. For each sample input, the novel device and/or method outputs two signals. One of the sample and hold circuits transfers a voltage which creates an output or "interpolated" voltage midway between the input voltage and an historical output voltage, while the second sample and hold circuit transfers a voltage sufficient to create an output voltage approximately equal to an input voltage. By generating two output voltage signals for every input voltage signal, sampling noise is reduced.

The present invention and its advantages can be best understood with reference to the drawings, detailed description of the invention and claims that follow.

DETAILED DESCRIPTION OF THE INVENTION

Figure 1:
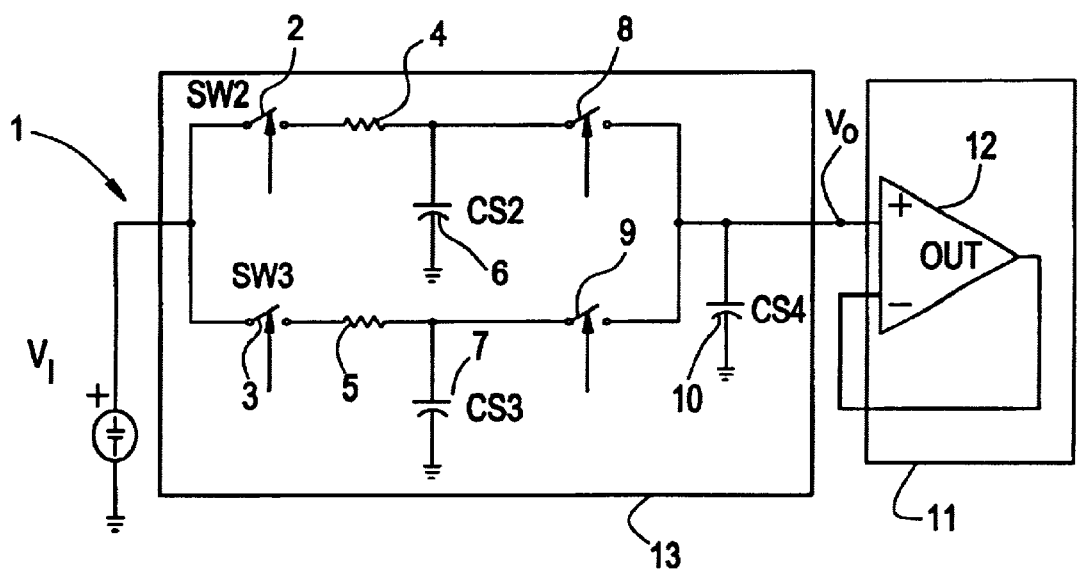
FIG. 1 depicts a device which reduces sampling noise according to one embodiment of the present invention.

FIG. 1 depicts a device 13 for reducing the sampling noise of an analog signal 1. The analog signal 1 can be characterized by an input voltage or signal, $V_I$. Prior to being input into the device 13, this input voltage was generated by conversion of a digital signal or voltage to an analog signal or voltage. Said another way, the input signal $V_I$ is a demultiplexed signal output from a digital-to-analog converter or the like. Though shown as a separate unit, it should be understood that the device 13 may be a part of a digital-to-analog converter, part of a larger device such as a codec or speech codec, or more specifically, part of a telephone answering device, cordless telephone or the like.

The device 13 has a number of components. In one embodiment of the invention, the device 13 comprises: first and second input switches or means 2,3; first and second circuits or circuit means 4,6 and 5,7; first and second output switches or means 8,9; and output capacitance or means 10. Though shown as discrete devices it should be understood that each of the components of device 13 may be a part of one or more integrated circuits ("IC"), such as a CMOS IC, or one or more electronic packages. In an illustrative embodiment of the invention, all of the components of device 13 comprise a single electronic package, integrated circuit or the like. In fact, device 13 may comprise a programmed device such as a digital signal processor or microprocessor, and appropriate program code which emulates the functions of the components shown in FIG. 1. As will be explained in detail shortly, the device 13 is designed to "transfer" portions of the input signal or voltage $V_I$ to the output capacitance 10. At any instant of time, the output voltage, $V_O$, of the device 13 is effectively the voltage which is stored by output capacitance 10. It should be further understood that the device 13 functions to transfer portions of the entire analog signal $V_I$ output from a codec or the like on a sample-by-sample basis to the output capacitance 10 and ultimately to an external device (not shown).

FIG. 1 also shows an amplification device 11 comprising an isolation amplifier 12. The device 11 acts as a buffer isolating the device 13 from other, possible interfering, circuits. It may or may not be made a part of device 13. In one embodiment of the invention the amplification device 11 is a separate device from the device 13.

Figure 2:
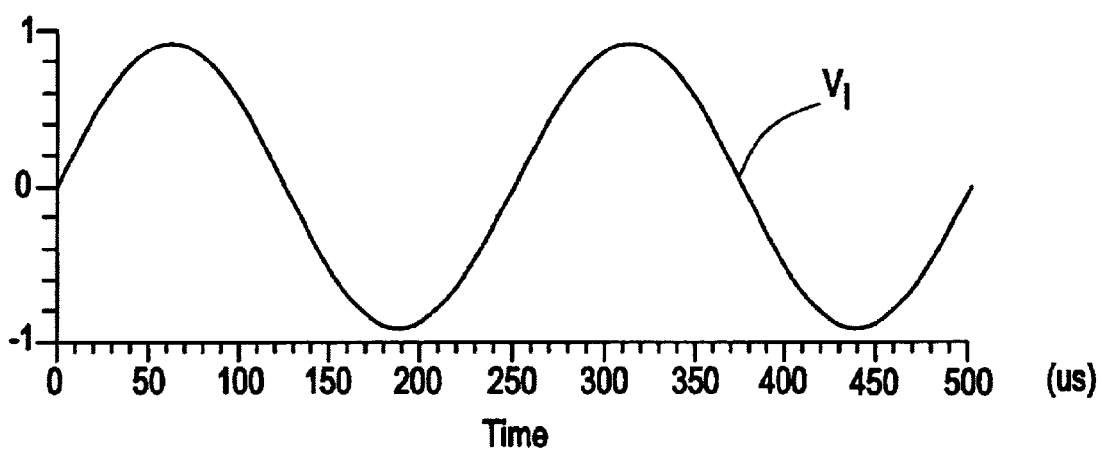
FIG. 2 depicts a graph of an ideal analog voltage signal input into the device depicted in FIG. 1.

FIG. 2 depicts an ideal, illustrative analog voltage signal, $V_I$, which can be "input" into device 13. In reality, the signal input into device 13 does not look like FIG. 2. Instead, the signal comprises a pulsed signal having pulses of extremely short duration. If such a signal represented audio signals, the pulses would be much too short for the human ear to detect. One of the functions of device 13 is to broaden these narrow pulses into longer, audible pulses. The signal shown in FIG. 2, therefore, is an example of an ideal signal which device 13 attempts to approximate. Said another way, though a pulsed signal is input into device 13, device 13 attempts to output a signal which approximates the ideal signal shown in FIG. 2. As can be seen in FIG. 2 the input voltage $V_I$ present at the input to device 13 varies from one instant of time to another. It is the goal of device 13 to transfer input voltages to the output capacitance 10 in order to approximate the signal shown in FIG. 2, while minimizing the amount of sampling noise introduced during the transfer.

The transfer of an input signal $V_I$ to the output capacitance 10 on a sample-by-sample basis will be explained in greater detail shortly. First, however, a few comments.

Throughout the discussion above and below, reference is made to the input voltage $V_I$. It should be understood the terms "$V_I$" or "input voltage" refers to the entire signal input into device 13 as well as to an instantaneous voltage present at any given time at the input to device 13. Said another way, an entire signal, such as a pulsed signal or a signal such as the ideal signal shown in FIG. 2, will be referred to as the input voltage $V_I$ or any part of a signal at a given instant of time will also be referred to as the input voltage $V_I$.

Next, though not shown in FIG. 1, the input switches 2,3 may be controlled by a DSP, appropriate logic circuits or the like. The DSP sends signals to input switches 2,3 causing them to open and shut at a given rate (i.e., time) or frequency (i.e., the number of times the switches are open and shut in one second). The opening and closing of the input switches 2,3 at a given rate effectively allows a "sample" of the input voltage $V_I$ to pass through the input switches 2,3 as long as the switches remain closed. For this reason the rate may be referred to as a "sampling rate". Each time the switches are closed a sample or part of the input voltage $V_I$ is allowed to pass through the switches 2,3. In one illustrative embodiment of the invention, the signals controlling the opening and closing of switches 2,3 comprise voltage signals.

Continuing, in an illustrative embodiment of the invention, the first and second input switches 2,3 are adapted to close at the same time. As stated above, at some instant of time, switches 2,3 receive a signal which forces them to close. Once closed, a sampled input voltage $V_I$ is transferred to first and second circuits 4,6 and 5,7. More specifically, the sampled input voltage $V_I$ is stored by a first capacitance or capacitance means 6 when the first switch 2 is closed and the same input voltage is stored by a second capacitance or capacitance means 7 when the second switch 3 is closed. The first and second circuits further comprise first and second resistances or resistive means 4,5. In an illustrative embodiment of the invention the first and second resistances comprise 10k resistors. Together, the first resistance and capacitance 4,6 comprise a first RC circuit or. RC circuit means. Likewise, the second resistance and capacitance 5,7 comprise a second RC circuit or RC circuit means.

The switches 2,3 remain closed for a short period of time and then receive additional signals which instructs them to open. The circuit is now in a so-called "hold" state. Both voltages stored by capacitances 6,7 during the time period when switches 2,3 are closed will be referred to as a sampling voltage. It is during this sampling of the input voltage $V_I$ that sampling noise is introduced into the signal.

Backtracking somewhat, because the combination of input switches 2,3 and capacitances 6,7 act to store a portion or sample of the entire input signal over a particular time period and hold it, these components are referred to as "sample and hold" circuits. The illustrative device shown in FIG. 1 comprises two sample and hold circuits.

Relatively soon after the first and second input switches 2,3 are opened the first output switch 8 receives a signal, such as a digital voltage signal from a DSP or the like, which forces it to close. Once switch 8 is closed, a portion of the sampling voltage stored in the first capacitance 6 is transferred to the output capacitance 10. In one embodiment of the invention, the first capacitance 6 has a capacitance value equal to the capacitance value of the output capacitance 10. The voltage transferred from the first capacitance 6 to the output capacitance 10 will therefore be equal to one half the difference in voltage between the voltage stored by the first capacitance 6 and the voltage stored by output capacitance 10. For example, if the voltage stored by first capacitance 6 is 5 volts and the starting voltage stored by output capacitance 10 was 1 volt, the difference would be 4 volts. The voltage transferred would be equal to one half the difference, or 2 volts. In sum, the new voltage stored by output capacitance 10 would increase from 1 volt to 3 volts when output switch 8 is closed. The voltage transferred from the first capacitance 6 may be referred to as a first transfer voltage.

Shortly after the output capacitance 10 stores the first transfer voltage the first output switch 8 receives another signal instructing it to open. Thereafter, the second output switch 9 receives a signal of its own instructing it to close. At this point the second capacitance 7 is adapted to transfer a voltage of its own on to the output capacitance 10. Before discussing that transfer, reference is made to FIG. 3.

Figure 3:
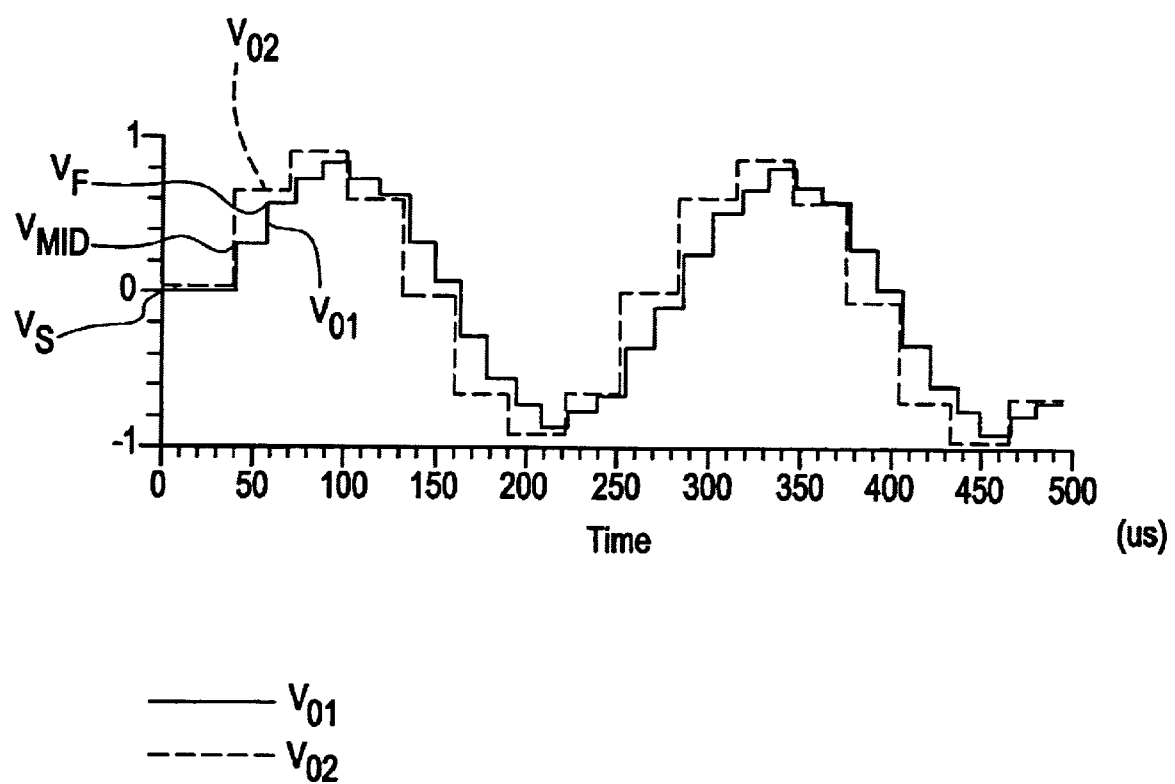
FIG. 3 depicts graphs comparing a sampled voltage signal output from the device shown in FIG. 1 with a sampled voltage signal output from another device which does not utilize the present invention.

FIG. 3 depicts two separate signals, $V_{O1}$ and $V_{O2}$. $V_{O1}$ represents a voltage signal (both complete signal and instantaneous signals) stored on, and output from, output capacitance 10. $V_{O2}$ represents a voltage signal output from another device which does not comprise the present invention (which will be briefly discussed below). Prior to the transfer of a voltage by second capacitance 7, the value of the voltage stored by the output capacitance 10 equals a starting voltage plus the first transfer voltage from the first capacitance 6. This voltage will be referred to as $V_{mid}$ or first output voltage. $V_{mid}$ represents a voltage midway between the starting voltage of output capacitance 10 and the input voltage $V_I$ stored initially by first capacitance 6. FIG. 3 shows the relationship between the starting voltage, $V_S$, and $V_{mid}$. Both $V_S$, and $V_{mid}$ represent voltages which are output by output capacitance 10 in order to form the complete output signal $V_{O1}$ shown in FIG. 3.

Referring back to FIG. 1, when the second output switch 9 closes, a portion of the voltage stored by the second capacitance 7 is transferred to the output capacitance 10. In the present invention, the capacitance value of the second capacitance 7 should be greater than the capacitance value of the output capacitance 10 to insure that a maximum voltage is transferred from second capacitance 7 to output capacitance 10. In an illustrative embodiment of the invention, the capacitance value of the second capacitance 7 is much greater than the capacitance value of the output capacitance 10. More specifically, in another embodiment of the invention the capacitance value of the second capacitance 7 is more than two and a half times as much as the capacitance value of the output capacitance 10. Given the fact that the capacitance value of the second capacitance 7 is much greater than the value of the output capacitance 10, second capacitance 7 will transfer voltage until the voltage level of the output capacitance 10 approximately equals the input voltage, $V_I$. That is, enough of the charge stored in the second capacitance 7 is transferred to the output capacitance to bring the voltage on the output capacitance 10 up to a voltage approximating the input voltage, $V_I$. The voltage transferred from the second capacitance 7 may be referred to as a second transfer voltage. Shortly after the second transfer voltage is stored by the output capacitance 10 the second output switch 9 receives a signal instructing it to open.

Chronologically, the voltage stored by the output capacitance 10 changes from a starting voltage $V_S$, to a midway voltage $V_{mid}$, to a final voltage, $V_f$, approximately equal to the input voltage $V_I$. The relationship of each of these voltages to one another is shown in FIG. 3. As with $V_S$, and $V_{mid}$, $V_f$ represents a voltage which is a part of the complete output signal $V_{O1}$ shown in FIG. 3.

After waiting a predetermined period of time signals are again sent to the first and second input switches 2,3 and the process is repeated. Each time, new $V_{mid}$ and $V_f$ signals are stored by the output capacitance 10 and eventually output. The process is repeated until the entire output signal $V_{O1}$, shown in FIG. 3 is generated and output by device 13.

As may be apparent by now, the signals shown in FIGS. 2 and 3 are related; the signal $V_I$ in FIG. 2 is an ideal signal which can be treated as if it were input into device 13 while $V_{O1}$ is a signal output from device 13 which approximates this ideal signal. FIG. 2 is referred to as a "sine wave" signal while FIG. 3 is referred to as a "staircase" signal. It should be understood that each of the stair-shaped signals shown in FIG. 3 represents an approximation of part of the signal shown in FIG. 2.

The advantages of using the device 13 to lower sampling noise will now be explained.

FIG. 3 depicts a second staircase signal, $V_{O2}$. This signal was derived from a device which comprises only one sample and hold circuit instead of the two which comprise the device 13 shown in FIG. 1. A comparison of the staircase signals $V_{O1}$ and $V_{O2}$ reveals that the two voltage steps from $V_S$ to $V_{mid}$, and from $V_{mid}$ to $V_f$ in $V_{O1}$ are equal to one step in $V_{O2}$. This increase in "steps" realized by device 13 translates into a reduction in sampling noise. The smaller the voltage steps between any two output voltages, e.g., $V_S$, $V_{mid}$, or $V_f$, the smaller the sampling noise. As is known in the art, staircase signals can be further broken down into a "signal frequency" ("f") and other frequencies which are around multiples of a sampling frequency, i.e., $f, f \pm f_s, f \pm 2f_s$, etc. . . . Smaller voltage steps translates into voltages at $f \pm f_s$, etc . . . . Smaller signals in turn mean less sampling noise. As noted above, device 13 comprises two sample and hold circuits. Each circuit is ultimately responsible for creating a voltage step. In the end, the net result of using two sample and hold circuits instead of one is a reduction in sampling noise.

It should be noted that $V_{mid}$ is not actually a voltage input into device 13 while $V_f$ approximates the input signal voltage, $V_I$. Instead, $V_{mid}$ is generated by device 13. The generation of output signals such as $V_{mid}$ is referred to as "linear interpolation". The present invention can be said to apply linear interpolation to an analog signal to reduce sampling noise. $V_{mid}$ can be referred to as an interpolated output signal or interpolated output voltage.

One other point is worth discussing in more detail. After $V_f$ is stored by output capacitance 10 and prior to the closing of the first and second input switches 2,3, $V_f$ becomes the new starting voltage, $V_S$. This starting voltage can be said to represent a "historical" voltage. Said another way, the starting voltage stored by output capacitance 10 represents the last voltage which was created when the second capacitance 7 transfers a voltage just before the sampling process begins again. As noted before, this historical or starting voltage corresponds to a point along the ideal signal shown in FIG. 2. Using the voltage values mentioned before, the starting or historical voltage would be 1 volt, the midway voltage would be 3 volts and the final voltage would be 5 volts. As the process begins again, however, 5 volts becomes the starting or historical voltage.

In another illustrative embodiment of the invention, the device 13 can be characterized by a transfer function, i.e., a mathematical equation, which governs the voltage transferred by the device 13. The transfer function can be expressed as:

$$V_{O1}/V_1 = Te^{j3}\pi^{f/2fs}\left(\frac{\sin(\pi f/f_s)}{(\pi f/f_s)}\right)\cos(\pi f/2f_s)$$

where $f$ = signal frequency, and $f_s$ = sampling frequency.

In one embodiment of the invention, the device 13 may be used to process voice band signals. In such an embodiment the frequency of the signal, f, input into the device 13 is at most 4 KHz while the sampling frequency, $f_S$, is equal to 32 KHz.

Using such frequencies sampling noise can be cut in half. Referring again to FIG. 3, using a signal frequency of 4 KHz and a sampling frequency of 32 Khz the sampling noise for $V_{O2}$ in FIG. 3 is approximately 21%, compared to 10% for $V_{O1}$.

Though the discussion above focuses on devices, the present invention also envisions methods for realizing the advantages offered by the present invention using devices like the one shown in FIG. 1.

It is to be understood that changes and variations may be made without departing from the spirit and scope of this invention as defined by the claims that follow.

We claim:

1. A device for reducing sampling noise comprising:
   first and second input switches adapted to connect an input voltage at the same time and further adapted to disconnect the input voltage at the same time;

first and second circuits adapted to store a sampling voltage equal to the input voltage, the first circuit adapted to store the sampling voltage upon connection of the first input switch to the input voltage and the second circuit adapted to store the sampling voltage upon connection of the second input switch to the input voltage;

first and second output switches adapted to alternatively connect the first and second circuits to an output capacitance; and an output capacitance adapted to store output voltages, a first output voltage comprising a starting voltage plus a first transfer voltage transferred from the first circuit when the first circuit is connected to the output capacitance and a second output voltage comprising the first output voltage plus a second transfer voltage transferred from the second circuit when the second circuit is connected to the output capacitance, the first transfer voltage further comprising a voltage equal to one-half a voltage difference between the sampling voltage and a historical voltage previously stored on the output capacitance and the second transfer voltage further comprising a voltage sufficient to raise the output voltage of the output capacitance to approximately the level of the input voltage.

2. The device as in claim 1 wherein the first circuit comprises a first capacitance.

3. The device as in claim 1 wherein the second circuit comprises a second capacitance.

4. The device as in claim 2 wherein a capacitance value of the first capacitance equals a capacitance value of the output capacitance.

5. The device as in claim 3 wherein a capacitance value of the second capacitance is greater than a capacitance value of the output capacitance.

6. The device as in claim 5 wherein the capacitance value of the second capacitance is more than two and one half times as much as the capacitance value of the output capacitance.

7. The device as in claim 5 wherein the capacitance value of the second capacitance is between the capacitance value of the output capacitance and a capacitance value equaling two and one half times as much as the capacitance value of the output capacitance.

8. The device as in claim 1 wherein the first and second input switches comprise CMOS switches.

9. The device as in claim 1 wherein a transfer function governing transfer of the input voltage to an output voltage comprises the equation:

$$V_{O1}/V_1 = Te^{j3}\pi^{f/2f_s}\left(\frac{\sin(\pi f/f_s)}{(\pi f/f_s)}\right)\cos(\pi f/2f_s)$$

where $f$ = symbol frequency and $f_s$ = sampling frequency.

10. The device as in claim 9 wherein the signal frequency comprises a 4 Khz signal and the sampling frequency comprises a 32 Khz signal.

11. The device as in claim 9 wherein the signal frequency comprises a signal lower than 4 Khz.

12. The device as in claim 1 wherein the device comprises part of a digital-to-analog converter.

13. The device as in claim 1 wherein the device comprises part of a codec.

14. The device as in claim 13 wherein the codec comprises a speech codec.

15. The device as in claim 1 wherein the device comprises an integrated circuit.

16. The device as in claim 1 wherein the device comprises an electronic circuit.

17. The device as in a claim 1 wherein the device comprises a programmed device.

18. The device as in claim 1 wherein the device comprises part of a telephone.

19. The device as in claim 1 wherein the device comprises part of a telephone answering device.

20. A device for reducing sampling noise comprising: first and second input switch means for connecting an input voltage at the same time and for disconnecting the input voltage at the same time; first and second circuit means for storing a sampling voltage, the first circuit means further adapted to store the sampling voltage upon connection of the first input switch means to the input voltage and the second circuit means adapted to store the sampling voltage upon connection of the second input switch means to the input voltage;

first and second output switch means for alternatively connecting the first and second circuit means to output capacitance means; and output capacitance means for storing output voltages, a first output voltage comprising a starting voltage plus a first transfer voltage transferred from the first circuit means when the first circuit means is connected to the output capacitance means and a second output voltage comprising the first output voltage plus a second transfer voltage transferred from the second circuit means when the second circuit means is connected to the output capacitance means, the first transfer voltage further comprising a voltage equal to one-half a voltage difference between the sampling voltage and a historical voltage previously stored on the output capacitance means and the second transfer voltage further comprising a voltage sufficient to raise the output voltage of the output capacitance means to approximately the level of the input voltage.

21. The device as in claim 20 wherein the first circuit means comprises a first capacitance.

22. The device as in claim 20 wherein the second circuit means comprises a second capacitance.

23. The device as in claim 21 wherein a capacitance value of the first capacitance equals a capacitance value of the output capacitance means.

24. The device as in claim 22 wherein a capacitance value of the second capacitance is greater than a capacitance value of the output capacitance means.

25. The device as in claim 24 wherein the capacitance value of the second capacitance is more than two and one half times as much as the capacitance value of the output capacitance means.

26. The device as in claim 24 wherein the capacitance value of the second capacitance is between the capacitance value of the output capacitance means and a capacitance value equaling two and one half times as much as the capacitance value of the output capacitance means.

27. The device as in claim 20 wherein the first and second input switch means comprise CMOS switches.

28. The device as in claim 20 wherein a transfer function governing transfer of the input voltage to an output voltage comprises the equation:

$$V_{OI}/V_1 = Te^{j3\pi f/2f_s}\left(\frac{\sin(\pi f/f_s)}{(\pi f/f_s)}\right)\cos(\pi f/2f_s)$$

where $f$ = symbol frequency and $f_s$ = sampling frequency.

29. The device as in claim 28 wherein the signal frequency comprises a 4 Khz signal and the sampling frequency comprises a 32 Khz signal.

30. The device as in claim 28 wherein the signal frequency comprises a-signal lower than 4 Khz.

31. The device as in claim 29 wherein the device comprises part of a digital-to-analog converter.

32. The device as in claim 29 wherein the device comprises part of a codec.

33. The device as in claim 32 wherein the codec comprises a speech codec.

34. The device as in claim 29 wherein the device comprises an integrated circuit.

35. The device as in claim 29 wherein the device comprises an electronic circuit.

36. The device as in a claim 29 wherein the device comprises a programmed device.

37. The device as in claim 29 wherein the device comprises part of a telephone.

38. The device as in claim 29 wherein the device comprises part of a telephone answering device.

39. A method for reducing sampling noise comprising:
   connecting an input voltage to first and second circuits at the same time;
   disconnecting the input voltage from the first and second circuits at the same time;
   storing a sampling voltage in the first circuit upon connection of the first input circuit to the input voltage;
   storing the sampling voltage in the second circuit upon connection of the second circuit to the input voltage;
   alternatively connecting the first and second circuits to an output capacitance; and
   storing output voltages, a first output voltage comprising a starting voltage plus a first transfer voltage transferred from the first circuit when the first circuit is connected to the output capacitance and a second output voltage comprising the first output voltage plus a second transfer voltage transferred from the second circuit when the second output circuit is connected to the output capacitance, the first transfer voltage further comprising a voltage equal to one-half a voltage difference between the sampling voltage and a historical voltage previously stored on the output capacitance and the second transfer voltage further comprising a voltage sufficient to raise the output voltage of the output capacitance to approximately the level of the input voltage.

40. The method as in claim 39 wherein the first circuit comprises a first capacitance.

41. The method as in claim 39 wherein the second circuit comprises a second capacitance.

42. The method a s in claim 40 wherein a capacitance value of the first capacitance equals a capacitance value of the output capacitance.

43. The method as in claim 41 wherein a capacitance value of the second capacitance is greater than a capacitance value of the output capacitance.

44. The method as in claim 43 wherein the capacitance value of the second capacitance is more than two and one half times as much as the capacitance value of the output capacitance.

45. The method as in claim 43 wherein the capacitance value of the second capacitance is between the capacitance value of the output capacitance and a capacitance value equaling two and one half times as much as the capacitance value of the output capacitance.

46. The method as in claim 40 wherein a transfer function governing transfer of the input voltage to an output voltage comprises the equation:

$$V_{OI}/V_1 = Te^{j3\pi f/2f_s}\left(\frac{\sin(\pi f/f_s)}{(\pi f/f_s)}\right)\cos(\pi f/2f_s)$$

where $f$ = symbol frequency and $f_s$ = sampling frequency.

47. The method as in claim 46 wherein the signal frequency comprises a 4 Khz signal and the sampling frequency comprises a 32 Khz signal.

48. The method as in claim 46 wherein the signal frequency comprises a-signal lower than 4 Khz.

* * * * *